United States Patent [19]
Yao

[11] Patent Number: 6,017,230
[45] Date of Patent: Jan. 25, 2000

[54] SEAT FOR A CASSETTE MEMORY

[76] Inventor: Li-Ho Yao, 4th Fl., No. 99-4, Tungan St., Taipei, Taiwan

[21] Appl. No.: 09/020,652

[22] Filed: Feb. 9, 1998

[51] Int. Cl.[7] ................................................... H01R 13/62
[52] U.S. Cl. .......................................... 439/159; 439/372
[58] Field of Search .................................... 439/152–160, 439/376, 153–5

[56] References Cited

U.S. PATENT DOCUMENTS

| | | | |
|---|---|---|---|
| Re. 35,938 | 10/1998 | O'Brien et al. | 439/160 |
| 5,451,168 | 9/1995 | Shuey et al. | 439/159 |
| 5,490,792 | 2/1996 | Yamada et al. | 439/159 |
| 5,507,658 | 4/1996 | Ho | 439/159 |

*Primary Examiner*—Lincoln Donovan
*Attorney, Agent, or Firm*—Kolisch Hartwell Dickinson McCormack & Heuser

[57] ABSTRACT

A seat for a cassette memory is disclosed. The seat has a bracket having two opposed posts, a plurality of pins formed through a central portion thereof for connection with said cassette memory, a recess defined therein and at least one L-shaped support formed on an outer face of one of said two posts; each one of said two posts having a guiding track defined therein and a positioning spring securely disposed within said track; a push rod movably mounted along a side of one of said two posts and having a slotted area defined therein, a cutout defined in a first distal end thereof and at least one opening corresponding to said L-shaped support of said bracket and defined in communication with said slotted area; and the eject knob securely connected to a second distal end of said push rod; a recoil spring compressibly mounted on said push rod and between a face of said eject knob and said L-shaped support; and a driving plate pivotally mounted onto said bracket and having a foot movably received within said cutout of said push rod and a pushing plate detachably connected with said cassette memory and detachably received in said recess of said bracket. With such an arrangement, the seat is able to receive and eject a cassette memory with ease.

5 Claims, 5 Drawing Sheets

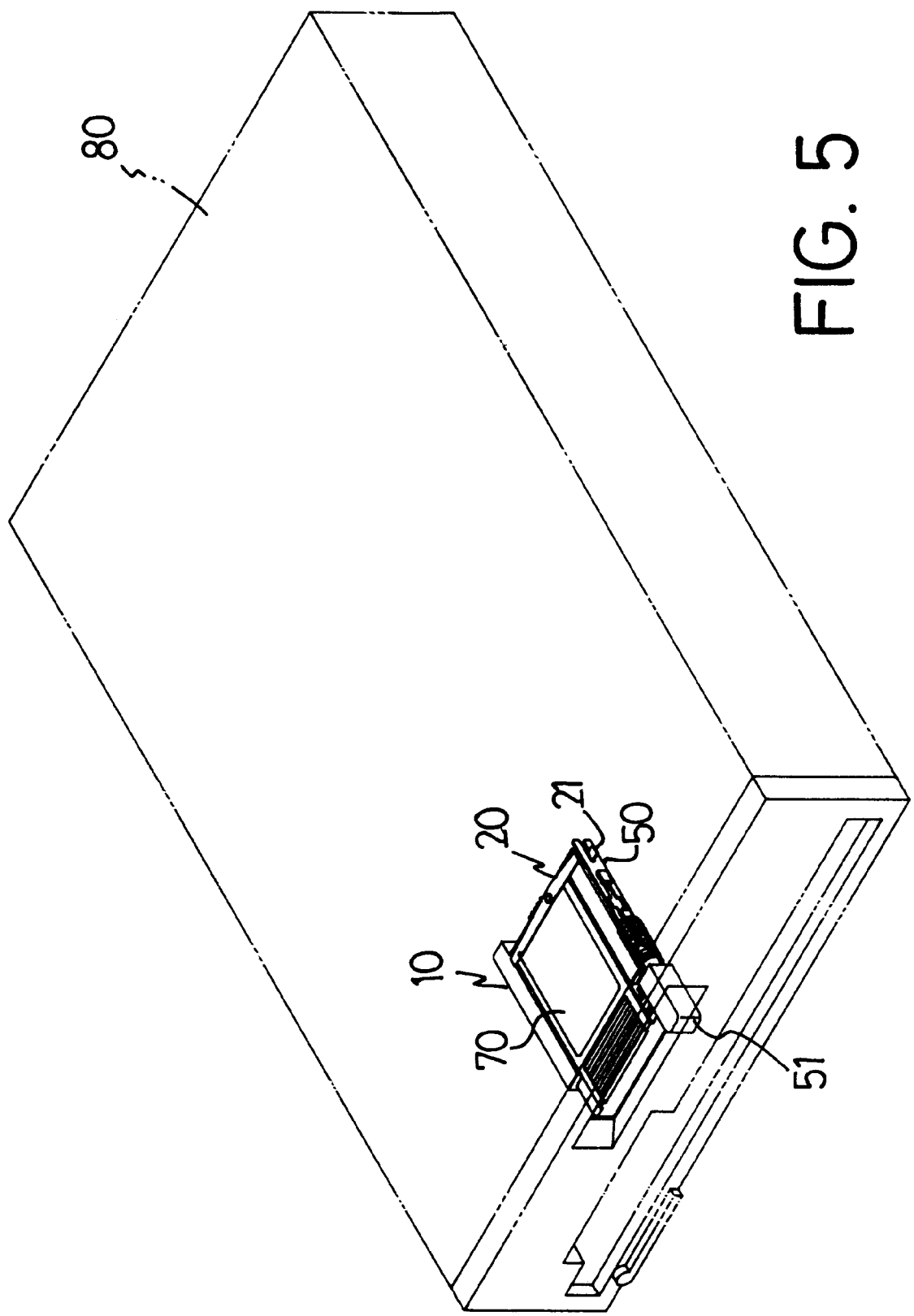

SEAT FOR A CASSETTE MEMORY

BACKGROUND OF THE INVENTION

1. Field of the Invention

The present invention relates to a seat, and more particularly to a seat for a cassette memory. The seat is able to be used in digital devices such as a digital camera, a digital recorder or even a computer to facilitate operation thereof

2. Description of Related Art

Due to the invention of digital cameras, people are now able to take pictures via a special cassette memory which is able to store images through a series of complex optical processes and then transmit the images onto a memory of a computer for further editing. Although such a cassette memory enables a user to use digital devices to edit images and thus eliminates the necessity of conventional films, such a cassette memory still suffers a drawback in that the space of a cassette memory is limited. Therefore, a user will need to constantly delete or transmit the images through cables to a computer database to empty the memory so as to proceed another operation, which not only increases an operator's trouble in processing the images, but also decreases the enjoyment of using digital cameras. Furthermore, due to the memory space of the cassette memory being limited, users are not able to take a lot of pictures in one operation.

Still, since the cassette memory of the present digital device is not replaceable, users will have to constantly change or empty the cassette memory so as to proceed the following procedure thereof, which indeed results in a lot of trouble.

The present invention provides a seat for a cassette memory to mitigate and/or obviate the aforementioned problems.

SUMMARY OF THE INVENTION

The main object of the present invention is to provide a seat for a cassette memory for use with digital devices, such as digital cameras or computers, which is able to overcome the drawback of limited space of a conventional digital device and thus increases the efficiency thereof by disposing a seat for a cassette memory in the digital device. A user is then able to take as many pictures as he/she wants as long as the user brings enough spare cassette memory.

Another objective of the invention is to provide a seat for a cassette memory which enables the user to insert the cassette memory into a digital device to dispose the cassette memory in position and withdraw the cassette memory by pressing a knob.

Other objects, advantages and novel features of the invention will become more apparent from the following detailed description when taken in conjunction with the accompanying drawings.

BRIEF DESCRIPTION OF THE DRAWINGS

FIG. 5 is a schematic view of a preferred embodiment of the seat.

DETAILED DESCRIPTION OF PREFERRED EMBODIMENT

Figure 1:
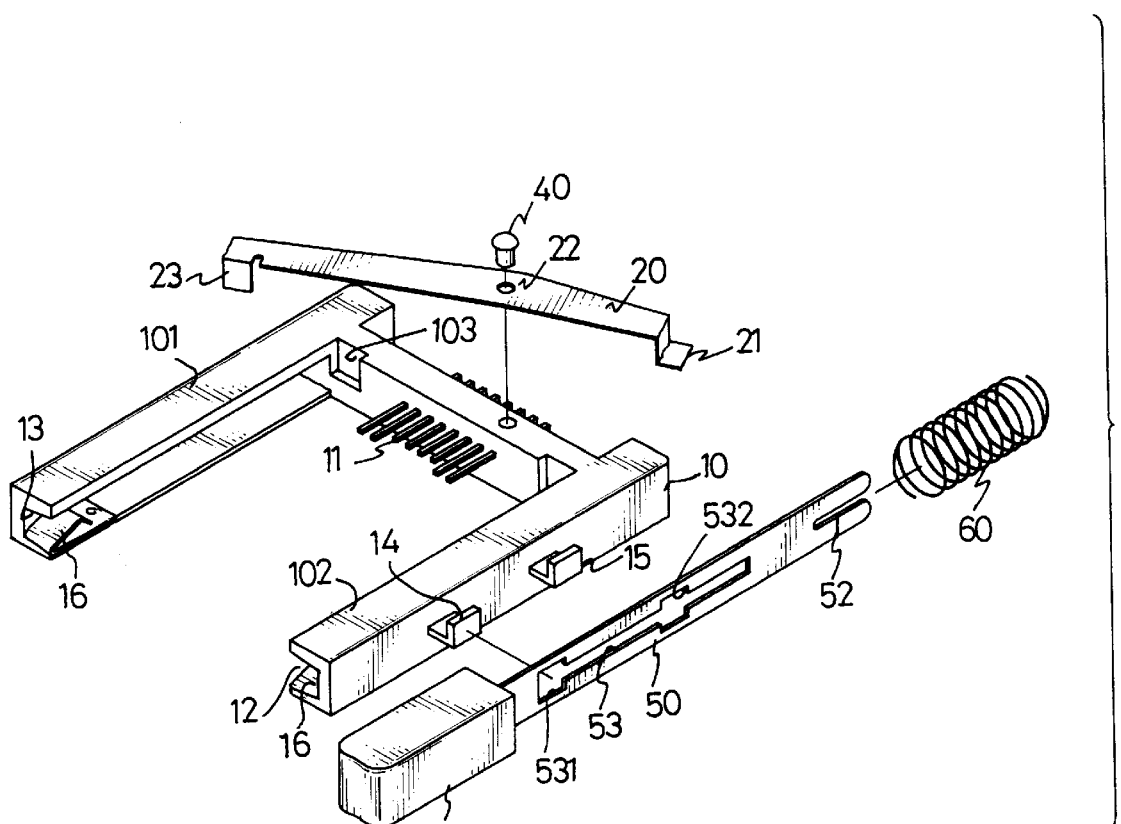
FIG. 1 is an exploded view showing a seat for a cassette memory and constructed in accordance with the present invention.
Figure 2:
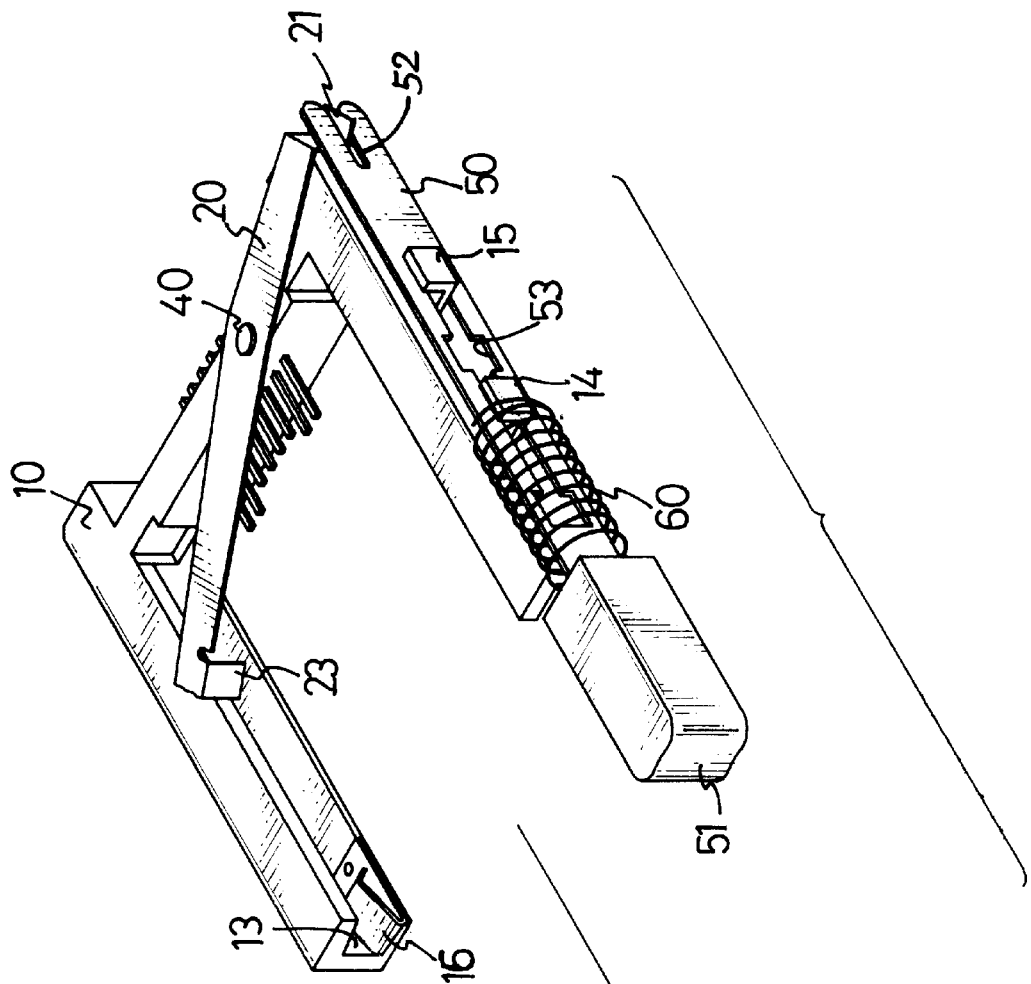
FIG. 2 is a perspective view of the seat of the invention when assembled.
Figure 2:
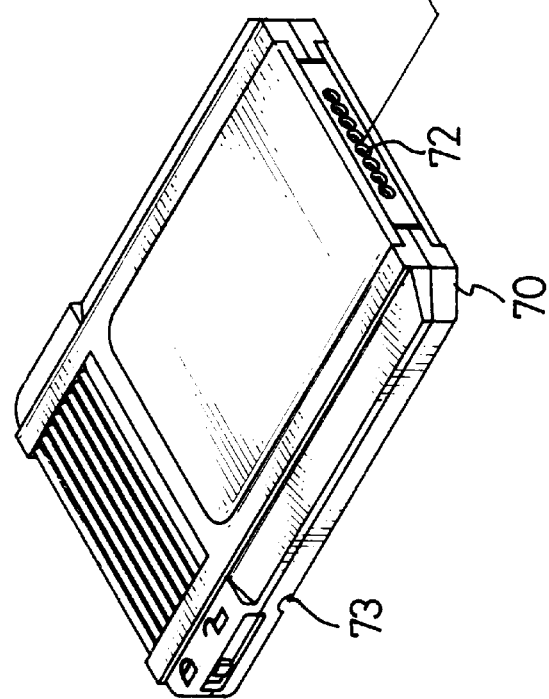

Referring to FIGS. 1 and 2, a seat for a cassette memory 70 comprises a bracket 10 which is substantially constructed as a U shape and has two guiding tracks 12, 13 respectively formed on one of two opposed posts 101, 102 thereof, two positioning springs 16 respectively and securely disposed on one of two distal ends of the posts 101, 102 and a plurality of pins 11 formed through a central portion of the bracket 10 and between the posts 101, 102 for providing electrical connection, a push rod 50 movable along an outer face of one of the two opposed posts 101, 102 and having a cutout 52 defined in a first distal end thereof and a slotted area 53 defined in a central portion thereof, an eject knob 51 securely connected to a second distal end (not labeled) of the push rod 50, a recoil spring 60 compressibly mounted around the push rod 50 and a driving plate 20 pivotally mounted onto the bracket 10 via a pivot 40. Furthermore, a first L-shaped support 14, and a second L-shaped support 15 are formed on an outer surface of one of the two posts 101, 102 for supporting the push rod 50. Due to the provision of two openings 531, 532 defined in the push rod 50 and in communication with the slotted area 53, the eject knob 51 together with the push rod 50 will have a recovery force from the recoil spring 60 after respectively inserting the first and second L-shaped supports 14, 15 of the bracket 10 into one of the corresponding openings 531, 532 of the push rod 50 and then pressing the eject knob 51 substantially toward the central portion of the bracket 10.

The driving plate 20 has a foot 21 extending downwardly from a first end thereof and a pushing plate 23 formed perpendicularly downward at a second end thereof, such that the foot 21 is able to be adapted to be received in the cutout 52 of the push rod 50 and the pushing plate 23 is able to be received within a recess 103 defined in the bracket 10, after the push rod 50 and the driving plate 20 are respectively mounted onto the bracket 10.

In assembly, it is noted that the recoil spring 60 is firstly mounted around the push rod 50 and is abutted against a face of the eject knob 51. Then, a user is able to respectively insert the first and second L-shaped supports 14, 15 into one of the corresponding openings 531, 532 of the push rod 50 and restrict the recoil spring 60 between the eject knob 51 and the first L-shaped support 14. The driving plate 20, as previously described, is in pivotal relationship with the bracket 10 via the pivot 40 which is inserted into a hole 22 defined in the driving plate 20. Therefore, when the bracket 10, the pushing rod 50, the eject knob 51 and the recoil spring 60 are assembled within a digital device, such as a digital camera of the like (not shown) as shown in FIG. 2, a cassette memory 70 is able to be assembled therewith. However, since the structure of the cassette memory 70 is not the focus of the invention, detailed description thereof is omitted.

Figure 3:
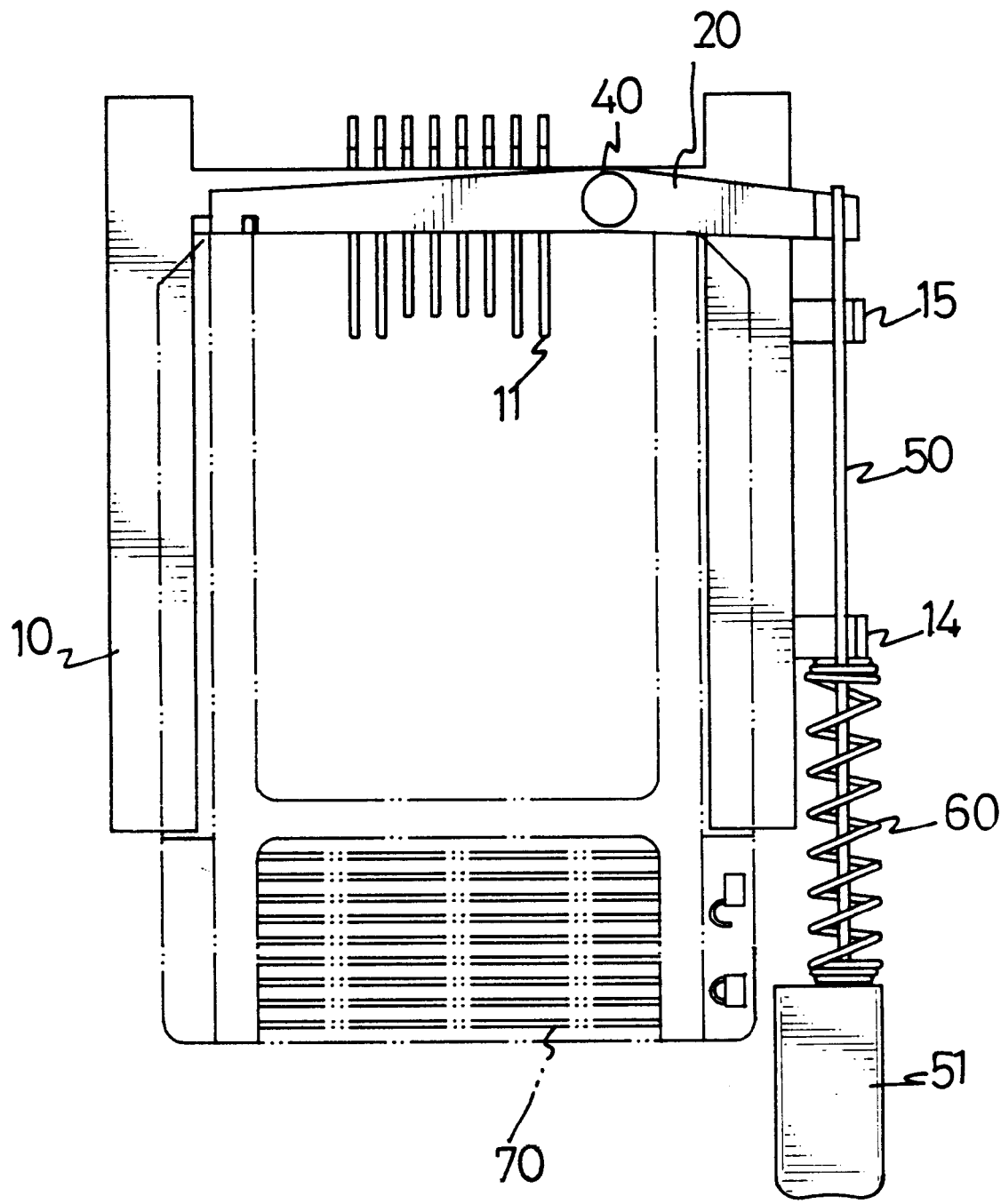
FIG. 3 is a schematic plan view showing an assembled state of the set with the cassette memory.

Referring to FIGS. 2 and 3, it is noted that a plurality of sockets 72 corresponding to the pins 11 of the bracket 10 are defined in a rear face of the cassette memory 70. When the cassette memory 70 is inserted into the seat of the invention through the guiding tracks 12, 13, mating of the pins 11 with the sockets 72 is able to position the cassette memory 70 within the seat of the invention. Furthermore, a groove 73 defined in a bottom face of the cassette memory 70 for receiving a tip of each of the positioning springs 16 is able to further position the cassette memory 70 within the seat when assembly process is completed. Still further, the pushing plate 23 is firstly received within the recess 103 so as to facilitate the assembly of the cassette memory 70 and the seat of the invention.

Figure 4:
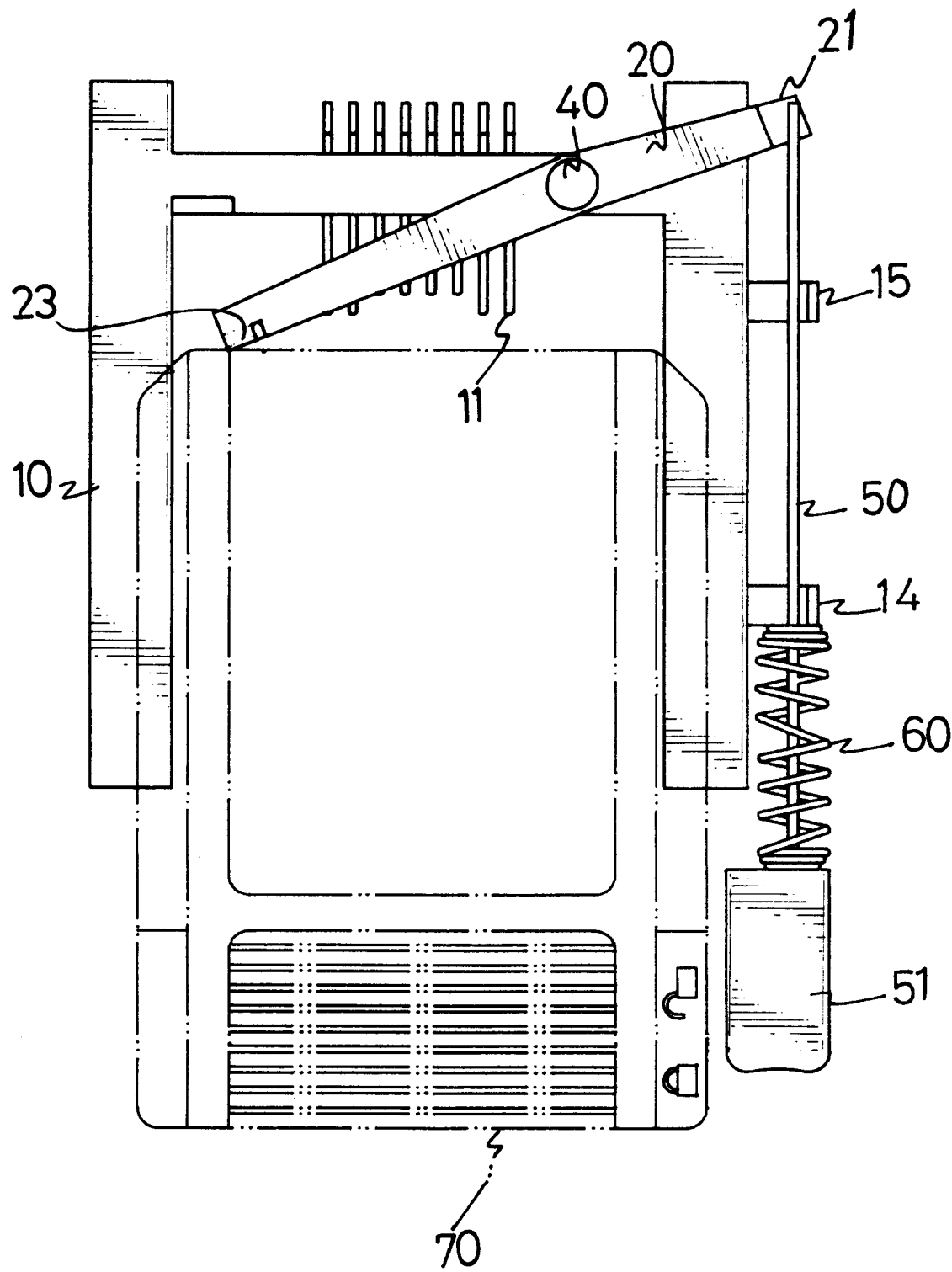
FIG. 4 is a schematic view showing a rejection operation of the seat of the invention after being inserted into a digital device.

Referring to FIG. 4, when the memory of the cassette memory 70 is occupied, a user can simply push the eject knob 51 to trigger the pivotal movement of the driving plate 20 and the pushing plate 23 will push the cassette memory 70 out of the seat and out of the digital device for replacement.

Referring to FIG. 5, it is notable that when the seat of the present invention is assembled within a digital device 80 and in connection therewith via the pins 11, as shown in FIG. 2, the eject knob 51 projects out from the digital device 80 so as to facilitate the ejection of the cassette memory 70 from the seat.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A seat for a cassette memory comprising:

a bracket having two opposed posts, a plurality of pins formed through a central portion thereof for connection with said cassette memory, a recess defined therein and at least one L-shaped support formed on an outer face of one of said two posts;

each one of said two posts having a guiding track defined therein and a positioning spring securely disposed within said track;

a push rod movably mounted along a side of one of said two posts and having a slotted area defined therein, a cutout defined in a first distal end thereof and at least one opening defined to communicate with said slotted area and to allow the at least one L-shaped support to be inserted therethrough;

an eject knob securely connected to a second distal end of said push rod;

a recoil spring compressibly mounted on said push rod and between a face of said eject knob and said L-shaped support; and a driving plate pivotally mounted onto said bracket and having a foot movably received within said cutout of said push rod and a pushing plate detachably connected with said cassette memory and detachably received in said recess of said bracket.

2. The seat as defined in claim 1, wherein each of said two posts have a positioning spring securely disposed within said track.

3. The seat as defined in claim 1, wherein said positioning spring functions for positioning the cassette memory.

4. The seat as defined in claim 1, wherein said driving plate has a foot movably received within said cutout of said push rod and a pushing plate detachably connected with a face of said cassette memory.

5. The seat as claimed in claim 1, wherein a recess is defined in said bracket for detachably receiving said pushing plate.

* * * * *